United States Patent [19]

Hori et al.

[11] Patent Number: 5,670,911
[45] Date of Patent: Sep. 23, 1997

[54] FET AMPLIFIER AND BIAS POWER SUPPLY CIRCUIT FOR COMMONLY AMPLIFYING MULTI-RADIO FREQUENCY (RF) SIGNALS

[75] Inventors: Tsuguo Hori, Tokyo; Atsushi Inahashi, Saitama, both of Japan

[73] Assignee: NEC Corporation, Tokyo, Japan

[21] Appl. No.: 664,025

[22] Filed: May 22, 1996

Related U.S. Application Data

[63] Continuation of Ser. No. 433,760, May 4, 1995, abandoned.

[30] Foreign Application Priority Data

May 23, 1994 [JP] Japan .................................. 6-107336

[51] Int. Cl.$^6$ .................................................. H03F 3/16
[52] U.S. Cl. .................................... 330/277; 330/296
[58] Field of Search .................................. 330/277, 285, 330/296, 297, 284

[56] References Cited

U.S. PATENT DOCUMENTS 5,371,477  12/1994  Ikeda et al. ...................... 330/285 X
5,406,225   4/1995  Iida et al. ........................ 330/296 X

FOREIGN PATENT DOCUMENTS 3-167909  7/1991  Japan .

OTHER PUBLICATIONS

"NEC Microwave Devise Data Book", 1992, pp. 506, NEC Corporation (No month).

Stephen A. Mass, "Nonlinear Microwave Circuits", published by Artech House, Inc., pp. 64–65, 1988 (No month).

*Primary Examiner*—Steven J. Mottola
*Attorney, Agent, or Firm*—Foley & Lardner

[57] ABSTRACT

A radio frequency FET amplifier has an FET which commonly amplifies a plurality of radio frequency signals and a bias power supplying circuit which varies bias power supplied to the FET according to the number of inputted radio frequency signals. A DC/DC converter controls supply voltage according to control voltage corresponding to the number of inputted radio frequency signals, thus generating a converter output voltage proportional to the control voltage. A constant current circuit supplies drain voltage substantially equal to the voltage to the drain terminal of the FET and also supplies gate voltage to the gate terminal of the FET so as to hold the drain current therein substantially constant. Power consumption is reduced depending on changes in the number of inputted radio frequency signals, while suppressing variations of harmonic distortion component peak level and frequency characteristics.

5 Claims, 4 Drawing Sheets

FET AMPLIFIER AND BIAS POWER SUPPLY CIRCUIT FOR COMMONLY AMPLIFYING MULTI-RADIO FREQUENCY (RF) SIGNALS

This application is a continuation of application Ser. No. 08/433,760, filed May 4, 1995 now abandoned.

BACKGROUND OF THE INVENTION

(1) Field of the Invention

This invention relates to field-effect transistor (FET) amplifiers with reduced power consumption, which find applications to radio equipment for cellular telephone systems and the like, and can commonly amplify a plurality of radio frequency signals.

(2) Description of the Related Art

A prior art technique for reducing power consumption in the type of FET amplifier to which the present invention relates, is disclosed in Japanese Patent Application Kokai Publication No. Hei 3-167909 under the title "FET Amplifiers". In this technique, a check is made within its own circuit as to whether there is any input signal (i.e., radio frequency signal(s)). If an input signal is detected, an FET as an amplifying element is rendered operative by turning "on" a drain current flowing therein. If there is no input signal to be amplified, the drain current in the FET is cut "off", thereby reducing power consumption in the FET amplifier.

In the above prior art FET amplifier, the effect of reducing the power consumption can be obtained only when there is no inputted radio frequency signal at all. However, in a low traffic condition in which only some of radio frequency signals are inputted to the FET amplifier, the function of power consumption reduction is not obtained.

Further, for this type of FET amplifier, it is required that, at the same time as the power consumption in low traffic conditions is reduced, non-linear distortion of the linearity, etc. and also linear distortion of amplitude/phase frequency characteristics, etc. are controlled such as to hold the deterioration of amplified radio frequency signals within a predetermined value.

SUMMARY OF THE INVENTION

An object of the present invention, therefore, is to overcome the problems existing in the prior art and to provide a system for reducing power consumption in FET amplifier, which permits reduction of the power consumption in low traffic conditions and also manages non-linear distortion of the linearity, etc. and also linear distortion of amplitude/phase frequency characteristics, etc. such as to hold the deterioration of amplified radio frequency signal within a predetermined value.

One system for reducing power consumption in FET amplifier according to the invention comprises an FET amplifier capable of commonly amplifying a plurality of radio frequency signals with an FET, and a bias power supplying circuit for varying the bias power supplied to the FET according to the number of inputted radio frequency signals.

In this system for reducing power consumption in FET amplifier, the bias power supplying circuit may have a structure such as to vary the drain voltage supplied to the drain terminal of the FET according to the number of inputted radio frequency signals and also vary the gate voltage of the FET to hold the drain current therein substantially constant.

The bias power supplying circuit may have a structure including a DC/DC converter for generating, from a DC voltage supplied thereto, a voltage corresponding to the number of inputted radio frequency signals at a converter output terminal, and a constant current circuit having drain current detecting means inserted between the converter output terminal and the drain terminal of the FET, for detecting the drain current flowing therein, and gate voltage supplying means for receiving or monitoring the detected drain current and then varying the gate voltage of the FET to hold the drain current constant.

Another system for reducing power consumption in FET amplifier according to the invention, may have a structure such that the bias power supplying circuit supplies the drain and gate voltages to the drain and gate terminals, respectively, of the FET and holds the drain current flowing therein substantially constant by increasing the drain voltage with increase of the number of inputted radio frequency signals and reducing the drain voltage with decrease of the number of inputted radio frequency signals.

A further system for reducing power consumption in FET amplifier comprises an FET amplifier capable of commonly amplifying a plurality of radio frequency signals with an FET, and a bias power supplying circuit for varying the drain and gate voltages supplied to the drain and gate terminals, respectively, of the FET so that the FET amplifier generates a substantially constant peak level of harmonic distortion component irrespective of changes in the number of inputted radio frequency signals.

The bias power supplying circuit may have another structure including a DC/DC converter for increasing the drain voltage with increase of the number of inputted radio frequency signals and reducing the drain voltage with decrease of the number of inputted radio frequency signals, a drain current detecting circuit for detecting the drain current in the FET, and a constant current circuit for receiving or monitoring the detected drain current value and then varying the gate voltage supplied to the gate terminal of the FET such as to hold the drain current therein constant.

BRIEF DESCRIPTION OF THE DRAWINGS

The above and other objects, features and advantages of the invention will become more apparent from the following detailed description of the preferred embodiments when the same is read with reference to the accompanying drawings, in which.

PREFERRED EMBODIMENTS OF THE INVENTION

Preferred embodiments of the invention will now be described with reference to the accompanying drawings.

Figure 1:
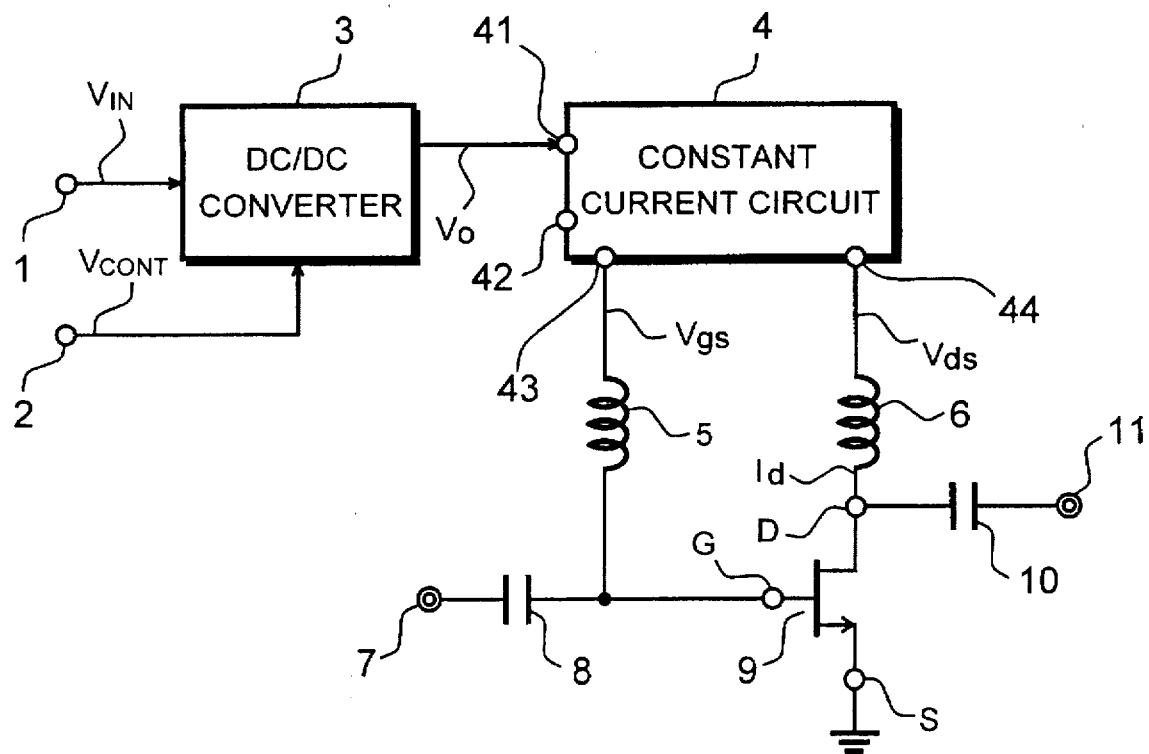
FIG. 1 is a schematic representation of an FET amplifier of a first embodiment according to the invention.
Figure 2:
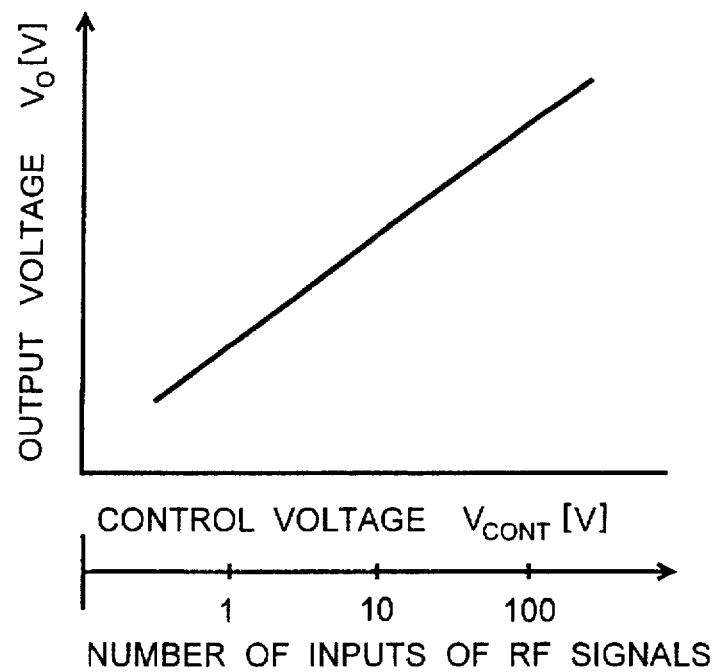
FIG. 2 is a graph showing an output voltage $V_O$ versus a control voltage $V_{CONT}$ in a DC/DC converter used in an FET amplifier of the first embodiment.

FIG. 1 is a schematic representation of a first embodiment of the invention, and FIG. 2 is a graph showing the output voltage $V_O$ versus the control voltage $V_{CONT}$ in a DC/DC converter used in an FET amplifier in the embodiment.

The FET amplifier in this embodiment includes an FET amplifier unit which can commonly amplify a plurality of radio frequency signals and a bias power supply circuit unit for supplying bias power to the FET amplifier unit.

In the FET amplifier unit, a single radio frequency signal or a plurality of radio frequency signals are inputted to an RF input terminal 7 and supplied via a capacitor 8 to a gate terminal G of an FET 9. The FET 9 has its source terminal S grounded, and receives at its gate terminal G a negative gate voltage $V_{gs}$ from a gate voltage output terminal 43 of a constant current circuit 4 via a choke coil 5 and also receives at its drain terminal D a positive drain voltage $V_{ds}$ from a drain voltage output terminal 44 of the constant current circuit 4 via a choke coil 6. The FET 9 commonly amplifies the radio frequency signals and the thus amplified radio frequency signals (signal) are outputted through a capacitor 10 to an RF output terminal 11. The FET amplifier unit generally requires, in addition to the above constituent elements, an input-side impedance matching circuit (not shown) for impedance matching with respect to the radio frequency signal source and also an output-aide impedance matching circuit (also not shown) for impedance matching of the amplified radio frequency signal with respect to an external circuit. Here, the constant current circuit 4 belongs to the bias power supply circuit unit.

The bias power supply circuit receives at its supply voltage input terminal 1 a supply voltage $V_{IN}$ and also at its control voltage input terminal 2 a control voltage $V_{CONT}$ which is substantially proportional to the logarithm of the number of inputted radio frequency signals. The control voltage $V_{CONT}$ can be internally obtained from the radio system that includes the FET amplifier. For example, where the FET amplifier is applied to a base station of an automobile telephone system, a control voltage generating circuit (not shown) receives data of radio frequency signals to be transmitted from the station, and logarithmically converts the number of the radio frequency signals to the control voltage $V_{CONT}$. The DC/DC converter 3 receives the supply voltage $V_{IN}$ and the control voltage $V_{CONT}$ and generates a converter output voltage $V_O$ proportional to the control voltage $V_{CONT}$ (see FIG. 2). As the DC/DC converter 3 having the above characteristics, use may be made of PAK-A and PAK-AM series DC/DC converters manufactured by Kikusui Denshi Kogyo Co., Ltd of Japan.

The converter output voltage $V_O$ is supplied to a positive voltage input terminal 41 of the constant current circuit 4. The constant current circuit 4 supplies the bias power corresponding to the converter output voltage $V_O$ to the FET amplifier unit. More specifically, the constant current circuit 4 outputs a drain voltage $V_{ds}$ from its drain voltage output terminal 44 and also a gate voltage $V_{gs}$ from the gate voltage output terminal 43. Preferably, the constant current circuit 4 supplies the bias voltages to the FET 9 such that it generates the drain voltage $V_{ds}$ substantially equaling the converter output voltage $V_O$ and also that the gate voltage $V_{gs}$ is changed so as to supply a substantially constant drain current $I_d$ from the drain voltage output terminal 44 to the FET 9 even where the converter output voltage $V_O$ changes. This control permits reduction of power consumption in the FET amplifier unit of this embodiment during low traffic conditions when there are a smaller number of inputted radio frequency signals. Further, as will be described later, it is possible to significantly reduce changes in amplitude/phase frequency characteristics with changes in the number of inputted radio frequency signals.

In the FET amplifier of this embodiment, it is preferable for the constant current circuit 4 to change the drain voltage $V_{ds}$ supplied to the drain terminal D of the FET 9 such that the peak level of harmonic distortion component generated in the FET amplifier unit is substantially constant irrespective of changes in the number of inputted radio frequency signals, i.e., changes in the converter output voltage $V_O$.

Where the FET 9 of the FET amplifier unit amplifies radio frequency signals in a substantially linear region of amplification characteristics, the output level of the amplified radio frequency signals is proportional to approximately 10 log (dB) of the number of inputted radio frequency signals. In addition, the harmonic distortion components, which are generated between the different radio frequency signals, in terms of the third harmonic distortion components, are proportional to approximately 20 log (dB) of the number of inputted radio frequency signals. In other words, where the drain and gate voltages supplied to the FET 9 are constant, a reduction of the number of inputted radio frequency signals from 100 to 10 (1/10, i.e., −10 dB) leads to a reduction of the third harmonic distortion component at the RF output terminal 11 to 20 dB irrespective of changes in the number of inputted radio frequency signals.

In usual communication systems, it is common that the radiation of the unnecessary wave components (spurious components) such as the third harmonic distortion is specified or limited in terms of the absolute level. In other words, when the number of inputted radio frequency signals is small, the power consumption of the FET amplifier may be reduced by lowering the drain voltage $V_{ds}$ supplied to the FET 9 without any problem being posed, because of this, even if there is an intercept point reduction and also there is an occurrence of a deterioration of the linearity of the FET amplifier, so long as the third harmonic (or other higher order harmonic) distortion component in the radio frequency signal outputted from the RF output terminal 11 is within the specified limits.

Accordingly, in the FET amplifier of this embodiment, when the number of inputted radio frequency signals is reduced, the drain voltage $V_{ds}$ of the FET 9 is reduced in a permissible harmonic distortion deterioration range. At the same time, the drain current $I_d$ is held substantially constant by making the gate voltage $V_{gs}$ shallower (i.e., by reducing the gate voltage $-V_{gs}$), thus reducing the power consumption which may be expressed as the product of the drain voltage $V_{ds}$ and drain current $I_d$. With the drain current $I_d$ held substantially constant irrespective of changes in the drain voltage $V_{ds}$, it is possible to obtain the effects, to be described later, of holding the harmonic distortion component peak level in the FET amplifier to be substantially constant irrespective of the number of inputted radio frequency signals and also of preventing the variations in the amplitude/phase frequency characteristics.

Figure 3:
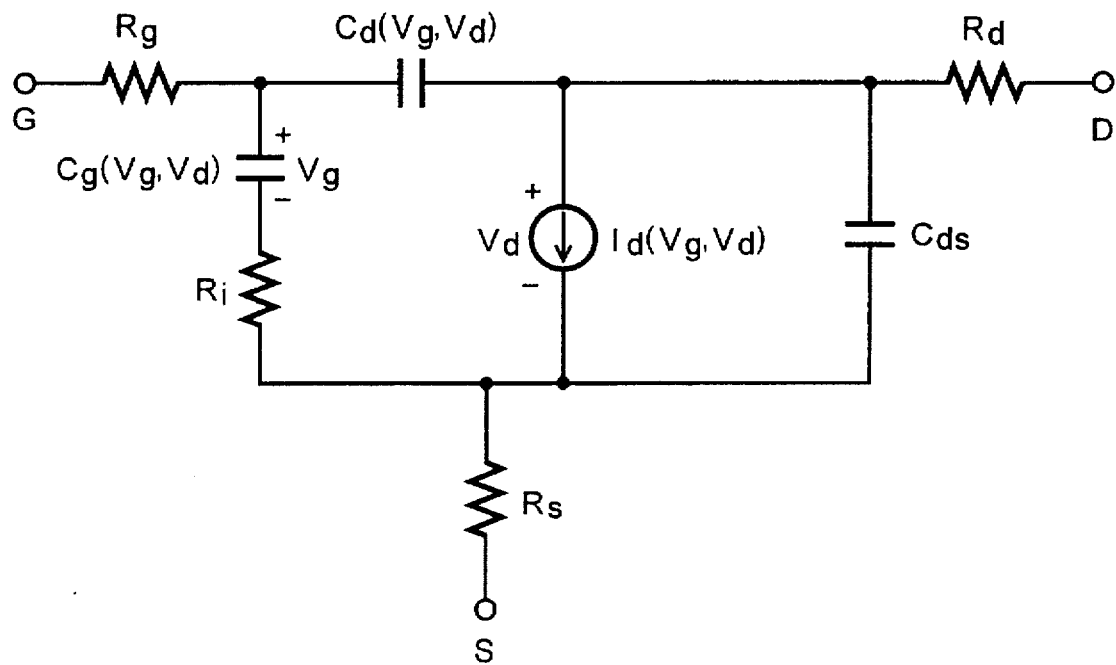
FIG. 3 is an equivalent circuit diagram, in terms of the radio frequency region, of the FET used in the first embodiment.
Figure 4:
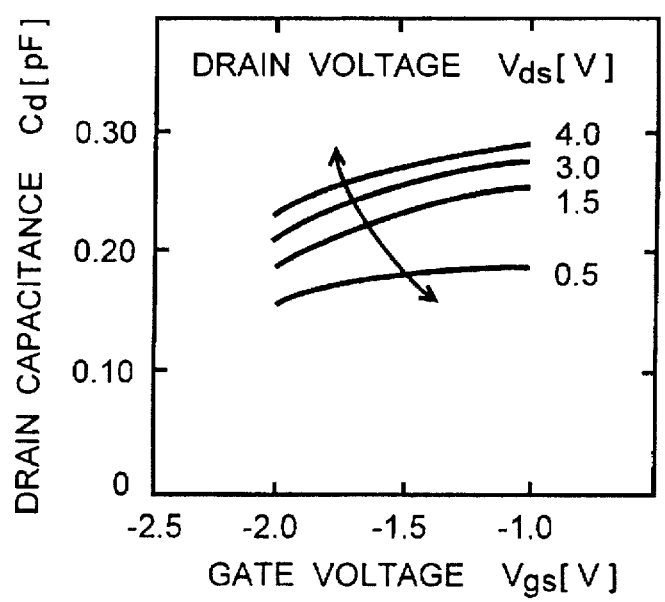
FIG. 4 is a graph showing the relation between a drain capacitance $C_d$ and a gate voltage $V_{gs}$ of the FET in the equivalent circuit diagram shown in FIG. 3.
Figure 5:
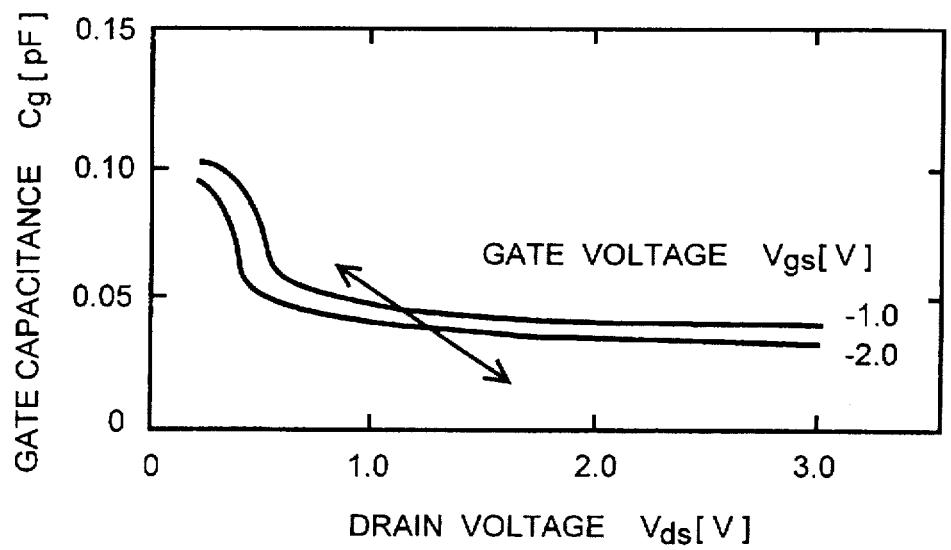
FIG. 5 is a graph showing the relation between a gate capacitance $C_g$ and a drain voltage $V_{ds}$ of the FET in the equivalent circuit diagram shown in FIG. 3.

FIG. 3 shows an equivalent circuit diagram of the FET 9 used in this embodiment. FIG. 4 is a graph showing the relation between the drain capacitance $C_d$ and the gate voltage $V_{gs}$ of the FET 9 in the equivalent circuit diagram shown in FIG. 3. FIG. 5 is a graph showing the relation between the gate capacitance $C_g$ and the drain voltage (i.e., drain-source voltage) $V_{ds}$ of the FET 9 in the equivalent circuit diagram shown in FIG. 3. FIGS. 3 to 5 are quoted from Stephen A. Maas, "Non-linear Microwave Circuits", published by Artech House, pp. 64–65.

Referring to FIG. 3, shown by $R_g$, $R_s$ and $R_d$ are respectively gate, source and drain terminal resistances $R_g$, $R_s$ and $R_d$, i.e., parasitic resistances to the gate, source and drain terminals G, S and D of the FET 9, and by $R_i$, an internal resistance, i.e., the gate-source resistance of the FET. Shown by $C_g$, $C_d$ and $C_{ds}$ are respectively gate, drain and drain-source capacitances, i.e., parasitic gate-source, drain-gate and drain-source capacitances. The drain current source $V_d$ that generates the drain current $I_d$ is inserted between the internal terminal side of the drain terminal resistance $R_d$ and the internal terminal side of the source terminal resistance $R_s$. The drain voltages $V_d$ and $V_{ds}$, and also the gate voltages $V_g$ and $V_{gs}$, are substantially equal except for the voltage drop across the resistors $R_g$, $R_i$, $R_d$ and $R_s$.

The mutual conductance $g_m$ which is the amplification degree of the FET 9, is a function of the drain current $I_d$ which may be expressed as the change in the drain current $I_d$ divided by the gate voltage $V_g$. The drain current $I_d$ is a function of the drain voltage $V_d$ which may be expressed as the drain voltage $V_d$ divided by the sum of the drain and source terminal resistances $R_d$ and $R_s$. By reducing the drain voltage $V_d$ only, the drain current $I_d$ is also reduced. To maintain the mutual conductance $g_m$ of the FET 9 constant even where the drain voltage $V_d$ is lowered, therefore, it is necessary to maintain the drain current $I_d$ constant. This dictates changing the gate voltage $V_g$ toward 0 volt, i.e., making the voltage $V_g$ shallower. Where the above relation is held, the FET amplifier provides a saturation output which is substantially proportional to the logarithm of the number of inputted radio frequency signals. Consequently, the harmonic distortion intercept point level is proportional to the logarithm of the number of inputted radio frequency signals, and the peak levels of the third and other higher order distortion components are not changed irrespective of the number of inputted radio frequency signals.

As described above, through the control of the drain and gate voltages $V_{ds}$ and $V_{gs}$, the drain and gate capacitances $C_d$ and $C_g$ are obviously varied as shown by arrows in FIGS. 4 and 5. The drain capacitance $C_d$, which is a function of the drain voltage $V_{ds}$ equal to the drain/source capacitance $C_{ds}$, is changed in the same manner as the drain-source capacitance $C_{ds}$.

Assume now that the drain voltage $V_{ds}$ on the FET 9 is reduced. The gate capacitance $C_g$ is thus increased (see FIG. 5). Further, the drain and drain-source capacitances $C_d$ and $C_{ds}$ are seen to be in series when they are looked at from the gate terminal G (see FIG. 3), and the resultant compound capacitance $C = (C_d \times C_{ds})/(C_d + C_{ds})$ is reduced by making the gate voltage $V_{gs}$ shallower (see FIG. 4). Thus, by reducing the drain voltage $V_{ds}$ while also reducing the gate voltage $V_{gs}$, that is, by holding the drain current $I_d$ substantially constant, the increment of the gate capacitance $C_g$ and the decrement of the resultant capacitance C cancel each other out, thus suppressing parasitic capacitance variations in the FET 9.

By increasing the drain voltage $V_{ds}$ of the FET 9, the gate capacitance $C_g$ is reduced (see FIG. 5). Further, with the gate voltage $V_{gs}$ made deeper, the compound capacitance C is increased, and the decrement of the gate capacitance $C_g$ and the increment of the resultant capacitance C cancel out.

Further, the gate and drain capacitances $C_g$ and $C_d$ are seen to be in series when looked at from the side of the drain terminal D of the FET 9 (see FIG. 3). This means that by changing the drain and gate voltages $V_{ds}$ and $V_{gs}$ in the manner as in the above two cases, it is possible to suppress the parasitic capacitance variations in the FET 9 although the obtainable effects are not as pronounced as in the above two cases.

As shown above, in the FET amplifier using the FET 9, although the drain voltage $V_{ds}$ of the FET 9 varies with changes in the number of inputted radio frequency signals, the gate voltage $V_{gs}$ is changed in correspondence to the drain voltage variations to hold the drain current $I_d$ constant. Thus, the reduction of impedance changes in the FET 9 viewed from the outside, results from changes in the parasitic capacitance of the FET 9. It is thus possible to suppress amplitude/phase frequency characteristic variations. In addition, the impedance matching on the input side and also on the output circuit side is not deteriorated, thus eliminating the power factor deterioration.

Further, the application of this FET amplifier to an automobile telephone system, in which a number of radio frequency signals are allotted in a broad frequency band, has the effects that there is no occurrence of any unbalance in gains between the base station and the mobile station and that there is no need to excessively reduce the cell radius.

Further, since the FET amplifier is subject to less amplitude/phase frequency characteristic variations, it has an advantage that, when used as the amplifier for commonly amplifying multiple frequencies as described above, it facilitates compensation of non-linear distortion by a linearizer.

Figure 6:
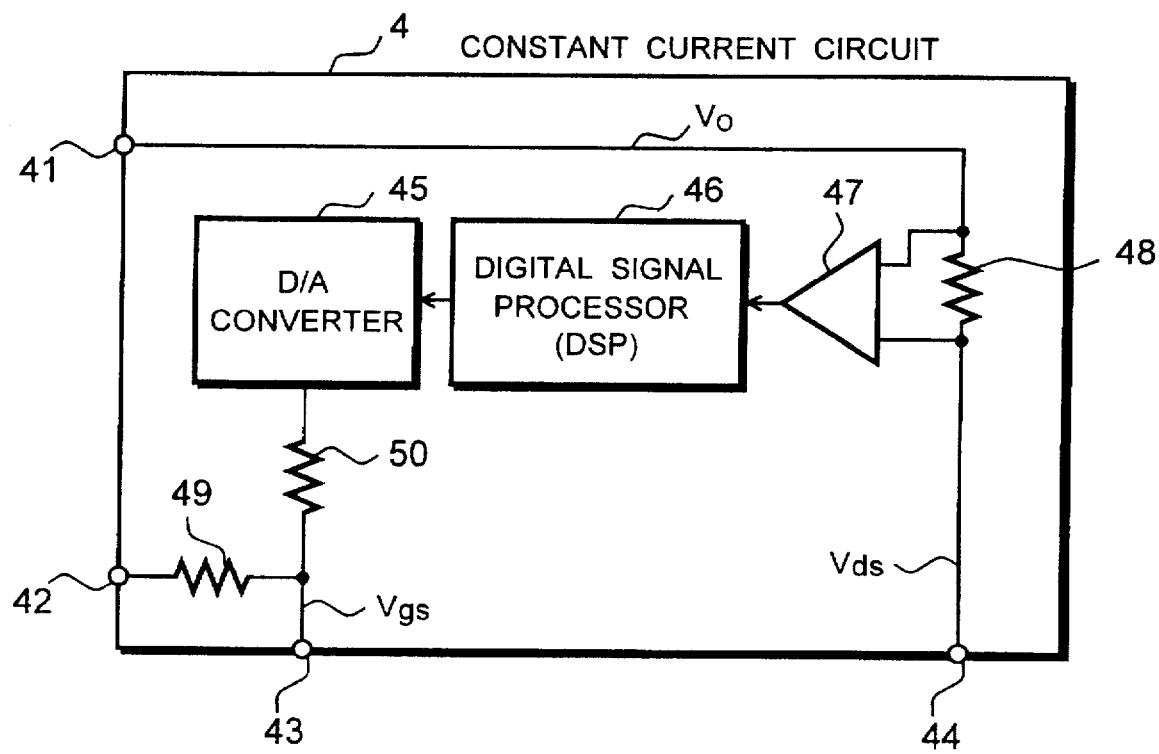
FIG. 6 is a block diagram of a constant current circuit used in the first embodiment.

FIG. 6 is a schematic representation of the constant current circuit 4 used in this embodiment.

In this constant current circuit 4, a positive voltage input terminal 41 which receives the converter output voltage $V_O$ is connected, via a resistor 48 for detecting the value of the drain current $I_d$ in the FET 9, to a drain voltage output terminal 44. The drain current $I_d$ thus produces a potential difference across the resistor 48. The potential difference is detected by a differential amplifier 47 and made to be a detected drain current value $I_{dd}$. The detected drain current value $I_{dd}$ supplied to a digital signal processor (DSP) 46 which is preferably formed by an integrated circuit including a CPU and a ROM and which is capable of software computation. In the ROM there is stored data of the drain current $I_d$, i.e., a specified drain current value $I_{dO}$, to be supplied to the FET 9. The DSP 46 compares the detected drain current values $I_{dd}$ and the specified drain current $I_{dO}$. If the detected drain current value $I_{dd}$ is greater than $I_{dO}$, the DSP 46 generates a digital signal for reducing the gate voltage $V_{gs}$. If $I_{dd}$ is smaller than $I_{dO}$, on the other hand, it generates a digital signal for raising the gate voltage $V_{gs}$. The digital signal thus generated is supplied to a D/A converter 45. The D/A converter 45 converts the received digital signal to the gate voltage $V_{gs}$, which is an analog signal. The gate voltage $V_{gs}$ is supplied to a gate voltage output terminal 43.

The constant current circuit 4 having the structure as described above, has a feature that it can sufficiently control the gate voltage $V_{gs}$ to be supplied to the FET 9, even if it uses the converter output $V_O$, that is subject to great changes, as the power source to be controlled for the drain voltage $V_d$.

In the constant current circuit 4 in FIG. 6, in addition to the above structure, a resistor 50 is connected between the output terminal of the D/A converter 45 and the gate voltage output terminal 43, a resistor 49 is connected between the gate voltage output terminal 43 and the negative voltage input terminal 42 to which the negative voltage (−Vn) is applied. Further, the negative voltage (−Vn) biasing the gate voltage $V_{gs}$ outputted from the D/A converter 45 is added to generate the gate voltage $V_{gs}$ supplied to the FET 9. With this structure, it is possible to use as the D/A converter 45 one that can generate only a positive voltage. In addition, there is an advantage that the D/A converter 45 may not have a wide dynamic range. The differential amplifier 47, DSP 46 and D/A converter 45 require use of a stably regulated voltage source.

Figure 7:
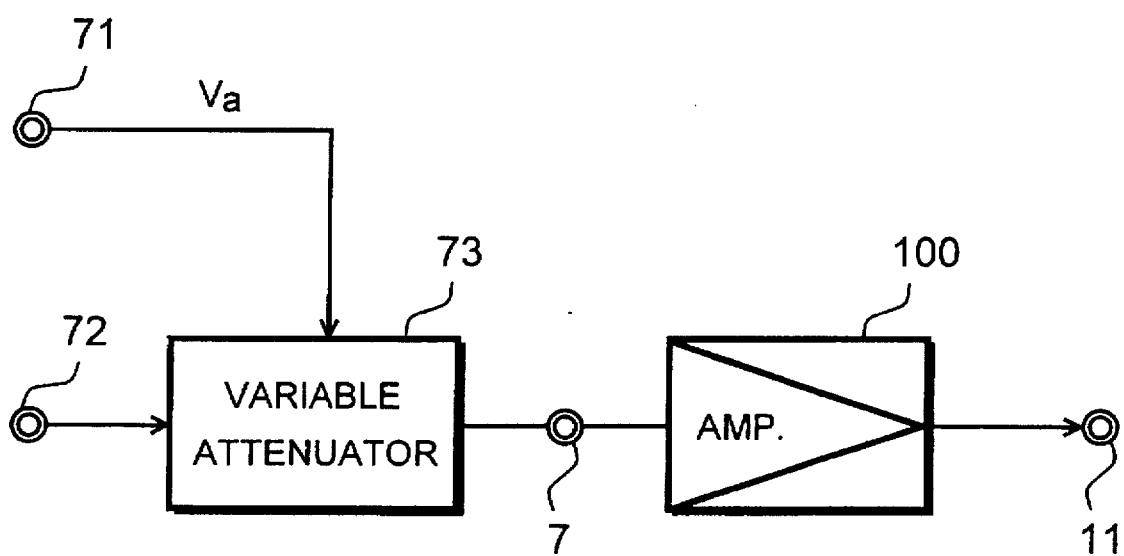
FIG. 7 is block diagram showing an FET amplifier of a second embodiment according to the invention.

FIG. 7 is a block diagram showing a second embodiment of the invention.

In the FET amplifier in the first embodiment (which is shown as FET 100 in FIG. 7), by reducing power consumption with decrease of the number of inputted radio frequency signals, there is in effect the reduction of the gain. Accordingly, in the FET amplifier of this second embodiment a variable attenuator 73 which receives a radio frequency signal(s) from an RF input terminal 72 is provided in a pre-stage of the FET amplifier 100. The variable attenuator 73 compensates the gain changes of the FET amplifier 100 with changes in the number of inputted radio frequency signals by causing variations of the radio frequency signal attenuation to occur according to a control voltage $V_a$ received from a gain correction signal input terminal 71. The control voltage $V_a$ corresponds to the number of inputted radio frequency signals, and it is determined on the basis of a previously measured gain change of the FET amplifier 100 in correspondence to the number of the inputted radio frequency signals. As the variable attenuator 73, use may be made of, for example, those which are described in "NEC Microwave Device Data Book", 1992, pp. 506, NEC Corporation.

As has been described in the foregoing, according to the invention, the bias power supplied to the FET is varied according to the number of inputted radio frequency signals. Thus, it is possible to obtain the effect that the power consumption of the FET amplifier can be reduced depending on the number of inputted radio frequency signals.

Further, with the FET amplifier according to one preferred mode of the invention, in addition to changing the drain voltage supplied to the FET drain terminal, according to the number of inputted radio frequency signals, the FET gate voltage is changed to hold the FET drain current substantially constant. Thus, in addition to the reduction of the power consumption described above, it is possible to obtain the effects of holding the harmonic distortion component peak level substantially constant irrespective of the number of inputted radio frequency signals and also reducing the amplitude/phase frequency characteristic variations. These effects provide the advantages of facilitating the linearizing of the FET amplifier and also facilitating the application thereof to the wideband communication systems.

Further, the FET amplifier does not deteriorate the impedance matching on the input side and also on the output circuit side, and further it does not deteriorate the power factor.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A radio frequency FET amplifier comprising:
    an amplifier circuit having an FET capable of commonly amplifying a plurality of radio frequency signals; and
    a bias power supplying circuit for varying bias power supplied to said FET according to a number of inputted radio frequency signals,
    wherein said bias power supplying circuit varies a drain voltage supplied to a drain terminal of said FET according to the number of inputted radio frequency signals and also varies a gate voltage of said FET so as to hold a drain current flowing in said FET substantially constant irrespective of changes in the number of inputted radio frequency signals, and
    wherein said bias power supplying circuit comprises:
        a DC/DC converter for generating, from a DC voltage supplied, a voltage corresponding to the number of inputted radio frequency signals at a converter output terminal; and
        a constant current circuit having a drain current detecting means inserted between the converter output terminal and the drain terminal of the FET for detecting the drain current, and a gate voltage supplying means for monitoring the drain current detected by said drain current detecting means and varying a gate voltage of the FET so as to hold the drain current substantially constant.

2. A radio frequency FET amplifier according to claim 1, wherein said bias power supplying circuit holds the drain current of said FET substantially constant by increasing the drain voltage with an increase of the number of inputted radio frequency signals and reducing the drain voltage with a decrease of the number of inputted radio frequency signals.

3. A radio frequency FET amplifier comprising:
    an amplifier circuit having an FET capable of commonly amplifying a plurality of radio frequency signals; and
    a bias power supplying circuit for varying drain and gate voltage supplied to drain and gate terminals, respectively, of said FET to provide a substantially constant peak level of harmonic distortion component generated by said amplifier circuit irrespective of changes in a number of inputted radio frequency signals,
    wherein said bias power supplying circuit comprises:
        a DC/DC converter for increasing the drain voltage with an increase of the number of inputted radio frequency signals and reducing the drain voltage with a decrease of the number of inputted radio frequency signals;
        a drain current detecting circuit for detecting the drain current flowing in the FET; and
        a constant current circuit for monitoring the drain current detected by said drain current detecting circuit and varying the gate voltage supplied to the gate terminal of the FET so as to hold the drain current therein substantially constant.

4. A radio frequency FET amplifier according to claim 1, wherein said amplifier circuit includes, in a pre-stage thereof, a variable attenuator for compensating for gain changes of the amplifier circuit corresponding to changes in the number of inputted radio frequency signals.

5. A radio frequency FET amplifier according to claim 3, wherein said amplifier circuit includes, in a pre-stage thereof, a variable attenuator for compensating for gain changes of the amplifier circuit corresponding to changes in the number of inputted radio frequency signals.

* * * * *